(12) United States Patent
Kautzsch

(10) Patent No.: US 9,885,605 B2
(45) Date of Patent: Feb. 6, 2018

(54) PHOTOCELL DEVICES, SYSTEMS AND METHODS

(71) Applicant: Infineon Technologies AG, Neubiberg (DE)

(72) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 65 days.

(21) Appl. No.: 14/281,199

(22) Filed: May 19, 2014

(65) Prior Publication Data

US 2015/0330836 A1    Nov. 19, 2015

(51) Int. Cl.
| | |
|---|---|
| *H01L 31/0232* | (2014.01) |
| *G01J 3/28* | (2006.01) |
| *G01J 3/02* | (2006.01) |
| *H01L 31/02* | (2006.01) |
| *H01L 31/10* | (2006.01) |
| *H01L 31/0216* | (2014.01) |
| *H01L 31/0224* | (2006.01) |

(52) U.S. Cl.
CPC ............. *G01J 3/28* (2013.01); *G01J 3/0264* (2013.01); *G01J 3/0272* (2013.01); *G01J 3/0291* (2013.01); *H01L 31/02019* (2013.01); *H01L 31/02162* (2013.01); *H01L 31/02327* (2013.01); *H01L 31/022408* (2013.01); *H01L 31/10* (2013.01)

(58) Field of Classification Search
CPC ............. H01L 27/1446; H01L 31/0216; H01L 31/02162; H01L 31/0232; H01L 31/02327; H01L 31/103

USPC ........ 257/184–201, 443, 464, 462, E23.127, 257/E27.133, E31.095, E31.123; 438/73
See application file for complete search history.

(56) References Cited

U.S. PATENT DOCUMENTS

| | | | | |
|---|---|---|---|---|
| 4,321,747 A | * | 3/1982 | Takemura | H01L 27/14868 257/222 |
| 5,994,720 A | * | 11/1999 | Snyman | H01L 33/0008 257/79 |
| 6,303,943 B1 | * | 10/2001 | Yu | B82Y 10/00 257/40 |
| 6,642,955 B1 | * | 11/2003 | Midgley | G08B 13/19643 348/14.1 |
| 6,803,557 B1 | * | 10/2004 | Taylor | H01L 27/14618 250/208.1 |
| 2003/0209651 A1 | * | 11/2003 | Iwasaki | H01L 27/302 250/214.1 |

(Continued)

OTHER PUBLICATIONS

Kautzsch et al., *A Trench Gate Photo Cell for Spectrometric Applications*, Infineon Technologies Dresden GmbH, IEEE International. 2013, 4 pages.

(Continued)

*Primary Examiner* — Hrayr A Sayadian
(74) *Attorney, Agent, or Firm* — Schiff Hardin LLP

(57) ABSTRACT

Embodiments relate to photoreceivers, such as photodiodes. In one embodiment, an integrated circuit device comprises a photodiode, and an electrode arranged over or on top of the photodiode. The electrode is substantially transparent or otherwise exhibits a lower absorption rate, such that light or other radiation can pass through the electrode to the photodiode. Varying a charge applied to the electrode enables the spectral sensitivity of the underlying photodiode to be altered, tuned or otherwise adjusted.

27 Claims, 3 Drawing Sheets

(56) References Cited

U.S. PATENT DOCUMENTS

| | | | | |
|---|---|---|---|---|
| 2004/0245917 | A1* | 12/2004 | Lu | H01L 51/5203 313/503 |
| 2008/0272413 | A1* | 11/2008 | Enichlmair | H01L 31/1136 257/290 |
| 2010/0051787 | A1* | 3/2010 | Hirose | H03K 17/785 250/214 DC |
| 2010/0308372 | A1* | 12/2010 | Mitsui | B82Y 10/00 257/184 |
| 2013/0062604 | A1* | 3/2013 | Kautzsch | H01L 31/0352 257/48 |
| 2013/0162330 | A1 | 6/2013 | Kautzsch | |

OTHER PUBLICATIONS

Wikipedia, *Color Vision*, as available on May 14, 2014, 10 pages.

* cited by examiner

PHOTOCELL DEVICES, SYSTEMS AND METHODS

TECHNICAL FIELD

Embodiments relate to photocell devices and more particularly to photocell devices comprising electrodes or other structures that provide for tuning of the spectral sensitivity of the photocell devices.

BACKGROUND

Devices such as mobile phones, tablets, laptops and others have displays, screens or other optical interfaces through which a user interacts with the device. In these devices, it can be desired to adjust the brightness of the display in relation to ambient light to make the display easier to view by the human eye, reduce energy consumption, and achieve other benefits. Conventionally, devices comprise a photoreceiver and an application-specific integrated circuit (ASIC) to sense ambient light and adjust (and readjust) the display brightness. A photoreceiver with a spectral sensitivity similar to that of the human eye can be advantageous because it responds to light in a way similar to that of the human eye.

Conventional approaches comprise either a separate photoreceiver and ASIC, or a photoreceiver integrated with the ASIC. While the latter can be advantageous because it is smaller in scale overall, proportionally photoreceivers generally remain larger because their minimum size is dependent on signal amplification from the ASIC. This means that size reduction of the ASIC itself are not realized for the device overall because the photoreceiver cannot be made smaller on the same scale. Another disadvantage of conventional integrated approaches is that they can require expensive filters and other components in order to compensate for infrared radiation properties of silicon.

SUMMARY

Embodiments relate to photoreceivers and related devices, systems and methods. In an embodiment, an integrated circuit device comprises a semiconductor substrate; a photoreceiver formed on the semiconductor substrate; and an electrode arranged proximate the photoreceiver and configured to receive a charge to alter a spectral response of the photoreceiver to incident light that passes through the electrode to the photoreceiver.

In an embodiment, a spectrometer comprises at least one device comprising a photoreceiver formed on the semiconductor substrate, and an electrode arranged proximate the photoreceiver and configured to receive a charge to alter a spectral response of the photoreceiver to incident light that passes through the electrode to the photoreceiver; and circuitry coupled to the at least one device and configured to determine a spectral composition of the incident light.

In an embodiment, a method comprises providing at least one photoreceiver to receive incident light; arranging at least one electrode to filter the incident light before being received by the photoreceiver; determining a spectral composition of the incident light received by the photoreceiver; and applying a charge to the electrode to adjust a spectral response of the photoreceiver to the incident light.

BRIEF DESCRIPTION OF THE DRAWINGS

The invention may be more completely understood in consideration of the following detailed description of various embodiments of the invention in connection with the accompanying drawings, in which.

Figure 1:
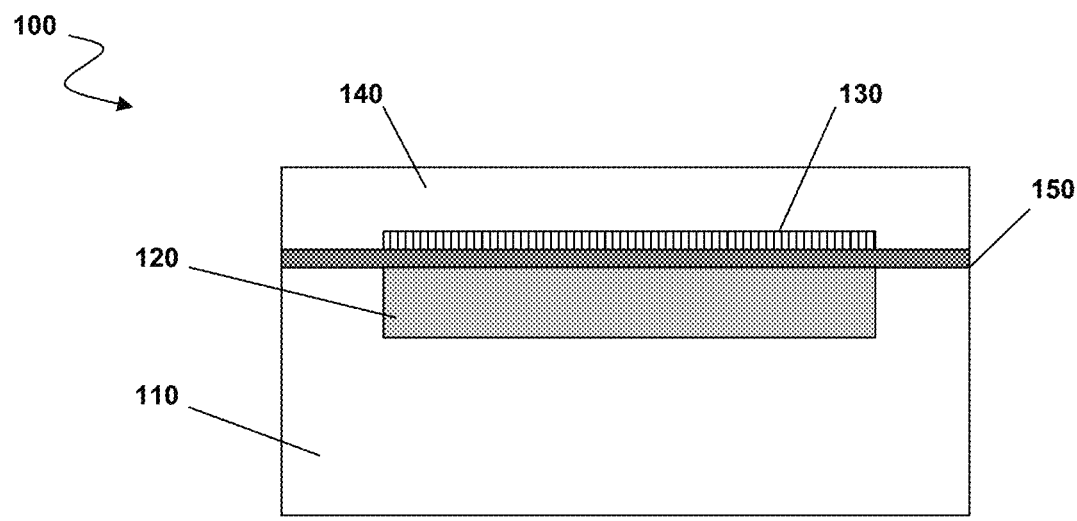
FIG. 1 is a side cross-sectional block diagram of an integrated circuit device comprising a photoreceiver according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to photoreceivers, such as photodiodes. In one embodiment, an integrated circuit device comprises a photodiode, and an electrode arranged over or on top of the photodiode. The electrode is substantially transparent or otherwise exhibits a lower absorption rate, such that light or other radiation can pass through the electrode to the photodiode. Varying a charge applied to the electrode enables the spectral sensitivity of the underlying photodiode to be altered, tuned or otherwise adjusted.

Referring to FIG. 1, an integrated circuit (IC) device 100 is depicted. Device 100 comprises a substrate 110, a photoreceiver 120, an electrode 130 and a back end of line (BEOL) stack portion 140. A layer 150 can separate photoreceiver 120 and electrode 130 in embodiments, and layer 150 can comprise oxide or another suitable material.

In embodiments, device 100 comprises a monolithic semiconductor stack formed on or from a semiconductor wafer or substrate in a semiconductor process. In other embodiments, device 100 can be assembled or built from distinct elements or parts according to suitable processes. Though not depicted in FIG. 1, device 100 can comprise a package, wiring, leads, bond pads and other structures for coupling device 100 with other circuitry, devices, power sources and other elements.

Substrate 110 can comprise a semiconductor substrate. In embodiments, substrate 110 can comprise silicon, silicon dioxide, silicon germanium or some other suitable material or alloy. Photoreceiver 120 can be formed in or on substrate 110. In embodiments, photoreceiver 120 comprises a photodiode. Though not shown in FIG. 1, photoreceiver 120 comprises an emitter region or layer, a collector region or layer, and a base region or layer, with the emitter region generally arranged proximate electrode 130. The emitter region and the base region are differently doped in embodiments. In embodiments, the emitter is about 500 nanometers (nm) thick or less. In one embodiment, the emitter region is n-doped, and the base region is p-doped, or vice-versa, and a depletion or space-charge region forms therebetween.

In this depletion or space-charge region, stationary, charged dopant atoms represent the vast majority of electric charges. In the p-doped boundary region of, for example, a silicon semiconductor, negatively charged acceptors (for example, boron atoms) are present. In the adjacent n-region positively charged donors (e.g., phosphor atoms) are located. These charges cause an electric field that acts upon mobile charges (negative electrons and positive holes).

An electron/hole pair generated by light may be separated by such an electric field. A precondition for this, however, is that the charge carriers are either generated in the depletion region (space-charge region) or reach the same by diffusion, when a suitable concentration gradient of the charge carriers exists and the pair of particles is not destroyed again before reaching the depletion region (recombination). From this, a photo voltage results and may lead to an exterior current flow when the regions are suitably contacted.

Equivalently, instead of an n-doped region, an inversion zone or region may be used. Here, by a suitable external potential (e.g., caused by a conductive plate insulated by an insulator, e.g., an oxide, from the semiconductor) the surface charge carrier concentration can be changed so that the electron concentration is higher than the hole concentration deep within the volume of the semiconductor. Thus, a depletion zone between the inversion zone and the deep volume is formed which is able to separate charge carrier pairs.

The photo current is thus a result of the cooperation of local fields (e.g., in depletion regions) and concentration gradients of mobile charges. The concentration gradients are defined by spatially varying generation and recombination processes and by transport processes.

The following example is presented to illustrate the cooperation between the local fields and the concentration gradients of mobile charges. At the surfaces of the semiconductor, unsaturated bindings (bonds) are present that cause an increased recombination of electrons and holes. In case of a charge carrier concentration that is above the equilibrium concentration, for example due to photo generation, mobile electrons and mobile holes are destroyed (i.e., they recombine) at the surfaces of the semiconductor. Hence, a concentration gradient is formed that causes charge carriers to diffuse from the interior of the semiconductor to the surface (s), so that these mobile charge carriers also recombine at the surface defects/impurities. These charge carriers subject to recombination at the surface(s) thus do not contribute to the photo current. Thus, also the depletion region in the internal volume of the semiconductor, at the pn junction (or at the inversion zone in case of a metal-insulator-semiconductor, MIS, structure), creates a charge carrier drain for the minority charge carriers (in the p-semiconductor these are the electrons, in the n-semiconductor the holes), as the described field extracts the same into the opposing region (or into the inversion zone). These charge carriers may contribute to the photocurrent when collected in a suitable manner.

To be more specific, in case the charge carriers are transported via the inversion zone to an external contact and, then, to an external circuitry as a photocurrent, a charge carrier concentration at, or near, the equilibrium concentration is maintained in the material of the semiconductor substrate adjacent (at the border) to the depletion zone/ inversion zone even during a photo generation of charge carriers in the semiconductor substrate. Thus, in response to a photo generation of charge carriers in the irradiation zone, a charge carrier concentration gradient is formed in the irradiation zone in a direction to the depletion zone (and the inversion zone adjacent thereto). This charge carrier concentration gradient effects a minority charge carrier diffusion to the depletion zone/inversion zone. Therefore the depletion zone acts as a charge carrier drain for the minority charge carriers photo generated in the irradiation zone.

The described processes are, in case of a photo generation (generation of electron/hole pairs by light), overlaid by a spatially varying generation process. On the one hand, a light beam that generates the same number of charge carrier pairs per wavelength unit causes an exponentially decaying irradiation strength in the semiconductor (evanescent light field). On the other hand, the absorption (generation) is dependent on the wavelength—blue light is absorbed substantially faster in silicon than red or infrared light. Thus, only by the irradiation of the semiconductor is a locally varying concentration of charge carriers caused. In particular the dependence of the absorption on the wavelength of the light may be used to enable a spectral evaluation of the light by an advantageous spatial setup of the photoreceiver.

Referring again to FIG. 1, device 100 further comprises electrode 130, which can comprise a material layer in embodiments. The material layer can comprise a transparent conductive oxide (TCO) or a silicon film, such as a thin polycrystalline silicon film that is less than about 50 nm thick, such as about 20 nm in one example embodiment. Electrode 130 can comprise other materials and/or have other dimensions in other embodiments and can, for example, comprise or be part of a multi-layer structure, such as a filter stack, in embodiments. In FIG. 1, a lateral dimension of electrode 130 is about the same as a lateral dimension of photoreceiver 120, though this need not be the case in other embodiments. In other words, electrode 130 can be wider or narrower than photoreceiver 120.

In some embodiments, electrode 130 is part of a filter stack of device 100. Additional layers of the stack can comprise filters that provide additional spectral sensitivity responses beyond those discussed herein below with respect to electrode 130 alone.

BEOL portion 140 can comprise contacts, insulating or dielectric layers, metal layers, pads and/or bonding sites or other structures to interconnect device 100 and/or portions of device 100 for operation.

Figure 2:
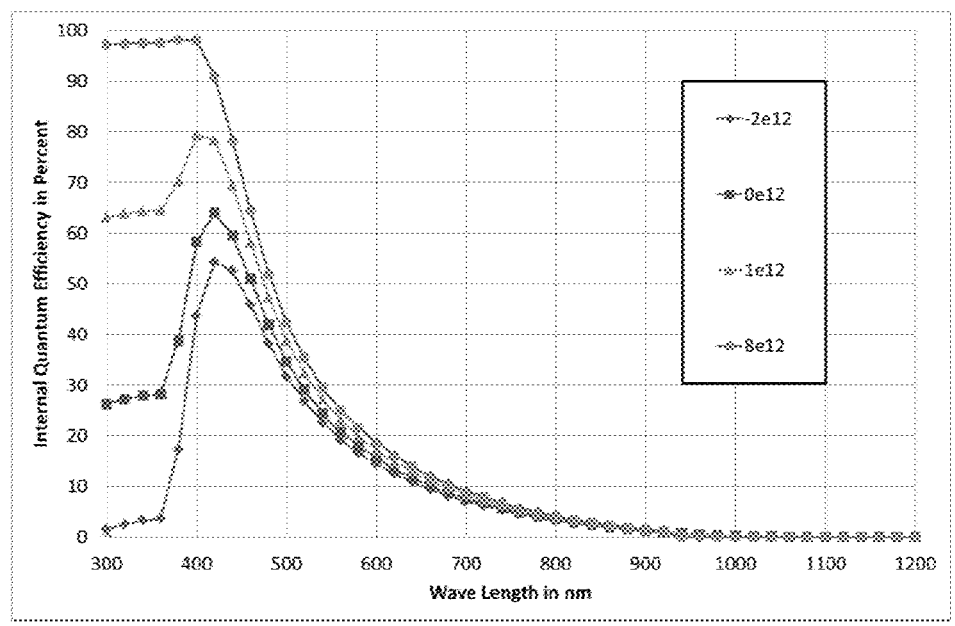
FIG. 2 is a graph of simulated spectral sensitivity of a photoreceiver with varying surface charge at an electrode according to an embodiment.

In operation, a charge can be applied to electrode 130, causing a change in the spectral response of photoreceiver 120. The applied charge (e.g., voltage) can vary the depletion of the region under electrode 130, which changes the recombination that occurs at the surface of photoreceiver 120, thereby leading to a different response of device 100. FIG. 2 is a graph of simulated spectral sensitivity of photoreceiver 120 with varying surface charge at electrode 130.

For example, in an embodiment the emitter region of photoreceiver 120 is n-doped, and a negative charge is applied to electrode 130. This increases minority carriers and leads to higher recombination at the surface of photoreceiver 120. A lower spectral response occurs in device 100. If instead a positive charge is applied to electrode 130, minority carries are rejected, lower recombination occurs at the surface of photoreceiver 120, and a higher spectral response occurs.

Figure 3:
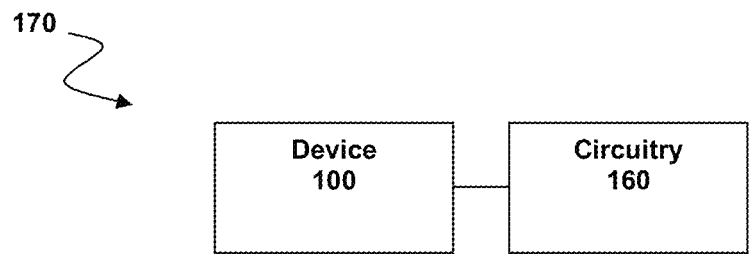
FIG. 3 is a block diagram of a spectrometer according to an embodiment.

Varying the charge applied to electrode 130 provides a set of response spectra of photoreceiver 120 that can be used to calculate the spectral response of incident light. In embodiments and referring to FIG. 3, circuitry 160 can calculate the spectral response. In one embodiment, circuitry 160 can be integrated in device 100, such as on the same chip, board or substrate; in the same package; and/or in some other integrated configuration. In other embodiments, circuitry 160 can be coupled to photoreceiver 120 or device 100 in some other configuration. In embodiments, device 100 and circuitry 160 can comprise a spectrometer 170.

Figure 4:
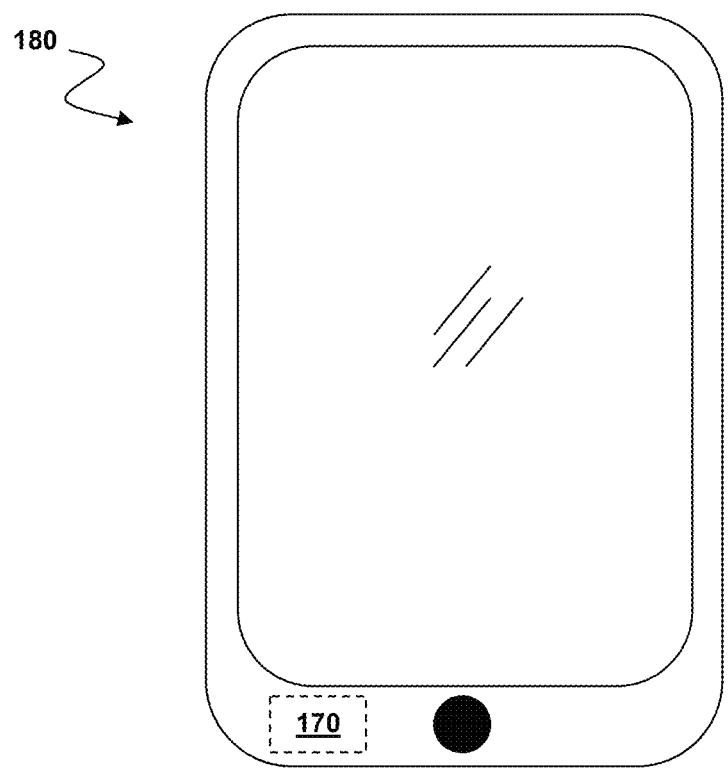
FIG. 4 is a diagram of a display device according to an embodiment.

Spectrometer 170 can comprise one or a plurality of photoreceivers 120 in embodiments, and one or a plurality of electrodes associated with the photoreceiver(s) 120. Referring also to FIG. 4, in embodiments spectrometer 170 can be arranged or integrated in a display device 180, such as a mobile phone or smartphone, tablet, laptop, computing device, television, screen, camera, or other device that is or comprises an optical display or screen. At least a portion of photoreceiver 120 can be exposed through a housing or packaging of device 180 to ambient light. A spectral response of spectrometer 170 similar to that of the human eye, which may be viewing the display or screen, can be desired.

Figures 5A, 5B, 5C:
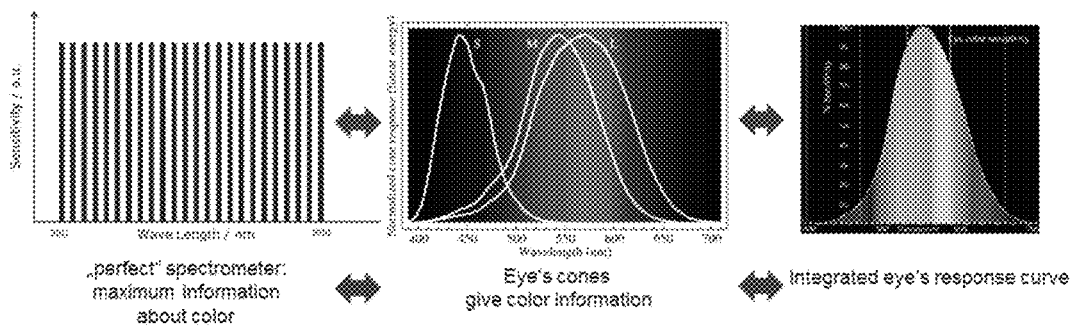
FIG. 5A is a graph of spectrometer response at various wavelengths of incident light according to an embodiment.
FIG. 5B is a graph of human eye cone response to light of different wavelengths.
FIG. 5C is a graph of an integrated response of the human eye based on FIG. 5B.

Referring also to FIG. 5, the spectral response of the human eye (FIG. 5C) is a combination of responses of three different cone types of the eye (FIG. 5B). A perfect spectrometer (FIG. 5A) would have information at every wavelength to mimic the response of the human eye, though without actually being able to recognize color, which is not necessary given that the wavelength information and related (single) response of photoreceiver 120 is sufficient.

Spectrometer 170 can sense ambient light, and the spectral composition of light incident on device 100 can be determined by circuitry 160. Based on the determined spectral composition, a characteristic (e.g., the brightness or another quality) of the display of device 180 can be adjusted in a way that is related or advantageous to the human eye. In other embodiments, a spectral response can be tuned for other targets, such as a camera, scanner or other object that may read a display instead of or in addition to a human eye.

Figure 6:
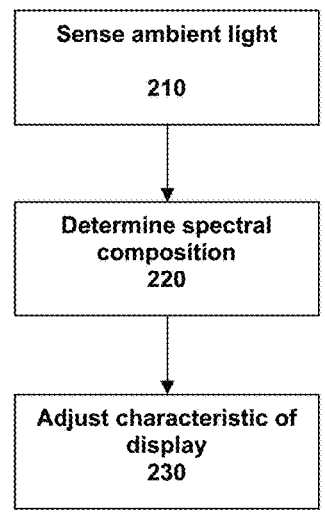
FIG. 6 is a flowchart according to an embodiment.

In other words, and referring to FIG. 6, ambient light is sensed at 210, such as by device 100. At 220, the spectral composition of the sensed light is determined, such as by circuitry 160 and/or spectrometer 170. At 230, a characteristic, such as a brightness, color balance or other characteristic, of the display can be adjusted based on the determined spectral composition of the sensed ambient light.

While embodiments discussed herein relate to a response of the human eye to visible light, still other embodiments can relate to responses other than those of the human eye and/or to light (i.e., infrared) other than that which is visible to the human eye. For example, embodiments can relate to the response of animal eyes, or to non-living devices, such as cameras or scanners that may need to read or interact with display devices. Still other embodiments can relate to light that is not visible to the human or another eye or device but still may affect or impact the viewing or another characteristic of a display or other device. In other words, the particular examples discussed herein are not limiting with respect to other embodiments, features or applications.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit device comprising:
a semiconductor substrate;
a photoreceiver formed on the semiconductor substrate;
a layer formed on the photoreceiver and the semiconductor substrate, wherein the layer directly contacts the photoreceiver and the semiconductor substrate; and
an electrode formed on and directly contacting the layer, the electrode being arranged proximate to the photoreceiver and separated from the photoreceiver and the semiconductor substrate by the layer, the photoreceiver being configured to receive a charge to alter a spectral response of the photoreceiver to incident light that passes through the electrode to the photoreceiver.

2. The device of claim 1, wherein the photoreceiver comprises a photodiode.

3. The device of claim 1, wherein the electrode is less than 50 nanometers (nm) thick.

4. The device of claim 3, wherein the electrode is 20 nm thick.

5. The device of claim 3, wherein the electrode comprises silicon.

6. The device of claim 1, wherein the semiconductor substrate, the photoreceiver and the electrode form a monolithic semiconductor device.

7. The device of claim 1, further comprising circuitry coupled to the photoreceiver and configured to determine a spectral response of the photoreceiver to the incident light.

8. The device of claim 1, further comprising a filter arranged proximate the electrode to filter the incident light.

9. The device of claim 1, wherein the spectral response is similar to a spectral response of the human eye.

10. The device of claim 1, wherein the charge is a voltage.

11. A spectrometer comprising:
at least one device comprising:
a photoreceiver formed on a semiconductor substrate;
a layer formed on the photoreceiver and the semiconductor substrate, wherein the layer directly contacts the photoreceiver and the semiconductor substrate; and
an electrode formed on and in direct contact with the layer, the electrode being arranged proximate to the photoreceiver and separated from the photoreceiver and the semiconductor substrate by the layer, the photoreceiver being configured to receive a charge to alter a spectral response of the photoreceiver to incident light that passes through the electrode to the photoreceiver; and
circuitry coupled to the at least one device and configured to determine a spectral composition of the incident light.

12. A method comprising:
providing at least one photoreceiver on a substrate, the at least one photoreceiver being configured to receive incident light;
forming a layer on the photoreceiver and the substrate, wherein the layer directly contacts the photoreceiver and the substrate;
arranging at least one electrode on the layer and to filter the incident light before being received by the photoreceiver, the at least one electrode being spaced apart from the photoreceiver and the substrate by the layer, wherein the electrode directly contacts the layer;
determining a spectral composition of the incident light received by the photoreceiver; and
applying a charge to the electrode to adjust a spectral response of the photoreceiver to the incident light.

13. The method of claim 12, further comprising adjusting a characteristic of a display device based on the determining.

14. The method of claim 13, wherein adjusting a characteristic comprises adjusting a brightness of the display device.

15. The method of claim 13, further comprising integrating a spectrometer comprising the photoreceiver and the electrode in the display device.

16. The method of claim 12, wherein the providing and arranging comprise providing an integrated circuit device comprising a semiconductor substrate, the photoreceiver and the electrode.

17. The method of claim 16, wherein the integrated circuit device comprises a monolithic integrated circuit device stack.

18. The method of claim 12, wherein the applying further comprises adjusting a spectral response of the photoreceiver to the incident light to be similar to a response of a human eye to the incident light.

19. The method of claim 12, further comprising forming the electrode of a transparent conductive oxide material.

20. The method of claim 19, further comprising forming the electrode in a filter stack.

21. The device of claim 1, wherein the layer is an oxide layer.

22. The device of claim 1, wherein a lateral dimension of the electrode is equal to a lateral dimension of the photoreceiver, and wherein a lateral dimension of the layer is greater than the lateral dimension of the electrode and the lateral dimension of the photoreceiver.

23. The device of claim 1, wherein the photoreceiver is formed within a recess of the semiconductor substrate such that a surface of the photoreceiver and a surface of the semiconductor substrate are coplanar.

24. The device of claim 23, wherein the layer contacts the surface of the photoreceiver and the surface of the semiconductor substrate.

25. The device of claim 1, wherein the layer directly contacts a surface of the photoreceiver and a surface of the semiconductor substrate, the surface of the photoreceiver and the surface of the semiconductor substrate being coplanar.

26. The device of claim 1, wherein the photoreceiver is formed directly on the semiconductor substrate.

27. The device of claim 1, wherein the photoreceiver comprises a n-doped region and a p-doped region.

* * * * *